(12) United States Patent
Iso

(10) Patent No.: US 10,262,925 B2
(45) Date of Patent: Apr. 16, 2019

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventor: Akira Iso, Kai (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/909,984

(22) Filed: Mar. 1, 2018

(65) Prior Publication Data

US 2018/0286788 A1 Oct. 4, 2018

(30) Foreign Application Priority Data

Apr. 3, 2017 (JP) .................. 2017-074069

(51) Int. Cl.
| | |
|---|---|
| *H01L 23/10* | (2006.01) |
| *H01L 23/492* | (2006.01) |
| *H01L 23/373* | (2006.01) |
| *H01L 23/04* | (2006.01) |
| *H01L 23/58* | (2006.01) |

(Continued)

(52) U.S. Cl.
CPC ...... *H01L 23/4928* (2013.01); *H01L 21/4817* (2013.01); *H01L 21/4871* (2013.01); *H01L 23/041* (2013.01); *H01L 23/3735* (2013.01); *H01L 23/585* (2013.01); *H01L 23/053* (2013.01); *H01L 23/24* (2013.01); *H01L 24/29* (2013.01); *H01L 24/32* (2013.01); *H01L 24/45* (2013.01); *H01L 24/48* (2013.01); *H01L 24/73* (2013.01); *H01L 2224/29101* (2013.01); *H01L 2224/32225* (2013.01); *H01L 2224/451* (2013.01); *H01L 2224/48091* (2013.01); *H01L 2224/48225* (2013.01); *H01L 2224/48227* (2013.01); *H01L 2224/73265* (2013.01); *H01L 2224/83447* (2013.01); *H01L 2924/1203* (2013.01); *H01L 2924/13055* (2013.01); *H01L 2924/13091* (2013.01); *H01L 2924/16195* (2013.01); *H01L 2924/181* (2013.01)

(58) Field of Classification Search
CPC ............... H01L 23/4928; H01L 23/041; H01L 23/3735; H01L 23/585; H01L 21/4817; H01L 21/4871
USPC .................... 257/707, 713; 438/122
See application file for complete search history.

(56) References Cited

U.S. PATENT DOCUMENTS 5,972,737 A * 10/1999 Polese .................. B22F 1/0003
  257/E23.105
9,397,018 B2 * 7/2016 Otremba ............. H01L 23/3107
(Continued)

FOREIGN PATENT DOCUMENTS

JP 2003-086745 A 3/2003

*Primary Examiner* — Nitin Parekh
(74) *Attorney, Agent, or Firm* — Rabin & Berdo, P.C.

(57) ABSTRACT

A semiconductor device includes a base plate to which a stacked substrate is bonded, the stacked substrate being mounted on a semiconductor chip. The semiconductor device further includes a heat sink mounted to the base plate, via thermal paste and a metal ring. A center hole of the metal ring is provided to face the semiconductor chip and the thermal paste fills the center hole. Further, the metal ring is formed using a material having about a same hardness as the heat sink, or a material having a lower hardness than the hardness of the heat sink.

11 Claims, 9 Drawing Sheets

(51) Int. Cl.
*H01L 21/48* (2006.01)
*H01L 23/00* (2006.01)
*H01L 23/053* (2006.01)
*H01L 23/24* (2006.01)

(56) References Cited

U.S. PATENT DOCUMENTS

| | | | | |
|---|---|---|---|---|
| 2005/0093131 | A1* | 5/2005 | Nakase | H01L 23/42 257/693 |
| 2007/0138596 | A1* | 6/2007 | Kitamura | H01L 23/051 257/565 |
| 2009/0104734 | A1* | 4/2009 | Specht | H01L 21/4817 438/117 |
| 2009/0140399 | A1* | 6/2009 | Schulz | H01L 23/041 257/660 |
| 2010/0078807 | A1* | 4/2010 | Schulz | H01L 23/34 257/713 |
| 2011/0031608 | A1* | 2/2011 | Kim | H01L 23/04 257/692 |
| 2013/0114209 | A1* | 5/2013 | Lai | H01L 23/36 361/700 |
| 2013/0270684 | A1* | 10/2013 | Negishi | H01L 21/565 257/675 |
| 2016/0190034 | A1* | 6/2016 | Okamotoa | H01L 23/13 257/692 |
| 2017/0117208 | A1* | 4/2017 | Kasztelan | H01L 23/4952 |
| 2017/0178997 | A1* | 6/2017 | Strawbridge | H01L 23/3735 |

* cited by examiner

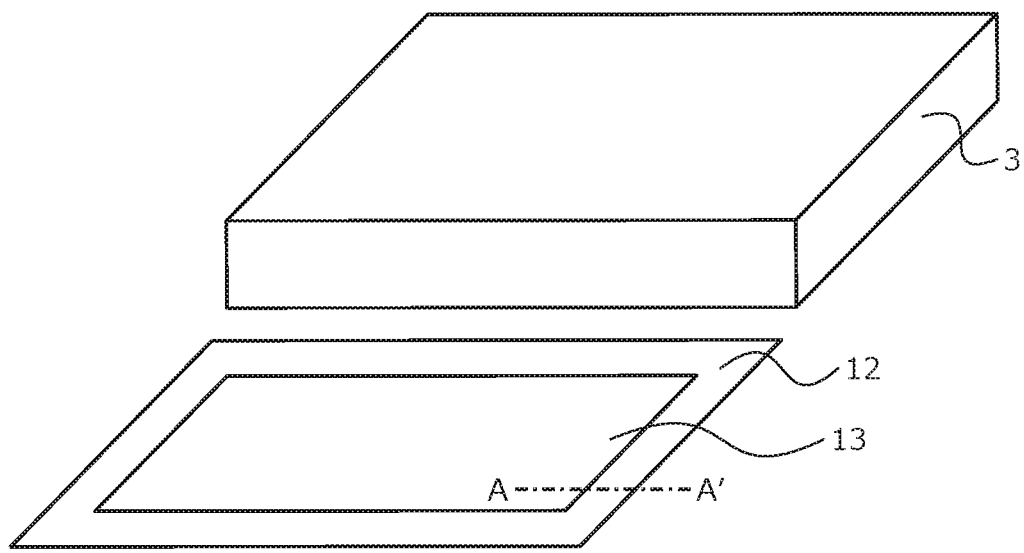
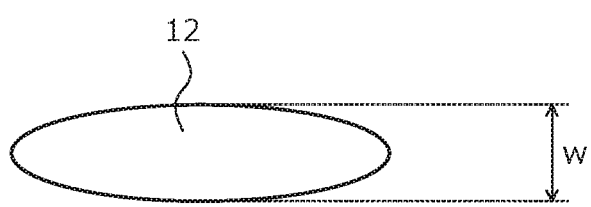

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2017-074069, filed on Apr. 3, 2017, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Centered on insulated gate bipolar transistors (IGBTs), power semiconductor modules have recently come to be widely used in power converting equipment. A power semiconductor module has one or more built-in power semiconductor chips and constitutes entirely or partially a conversion connection. Additionally, a power semiconductor module is a power semiconductor device having a structure electrically insulated between the power semiconductor chip and, a base plate or a cooling surface.

FIG. 11 is a cross-sectional view of a configuration before a heat sink is mounted in a power semiconductor module of a related art. FIG. 12 is a cross-sectional view of the configuration after the heat sink is mounted in the power semiconductor module of a related art. As depicted in FIGS. 11 and 12, the power semiconductor module includes a power semiconductor chip 101, a stacked substrate 102, a base plate 103, a case 104, a metal terminal 105, a metal wire 106, a cover 107, a sealant 108, and a heat sink 1011.

The power semiconductor chip 101 is a power semiconductor chip such as an IGBT or a diode, and is mounted on the stacked substrate 102. The stacked substrate 102 includes a conductive plate 1022 containing copper, etc. provided on a front surface and a rear surface of an insulated substrate 1021 such as a ceramic substrate. The stacked substrate 102 is soldered to the base plate 103. The case 104 is adhered to the base plate 103 by an adhesive. The case 104 is molded of a thermoplastic resin such as polyphenylene sulfide (PPS). The metal terminal 105 is fixed on the stacked substrate 102 by solder, penetrates the cover 107 and protrudes externally. The metal wire 106 electrically connects the power semiconductor chip 101 and the metal terminal 105. The cover 107 is molded using the same thermoplastic resin as that of the case 104. The sealant 108 fills the case 104, insulating and protecting the power semiconductor chip 101 on a substrate on which a power chip and a surface of the stacked substrate 102 are mounted. For the sealant 108, an ordinary epoxy resin is used. Epoxy sealing resin is dimensionally stable and has high water resistance/chemical resistance and electrical conductivity, making epoxy sealing resin suitable as a sealant.

The heat sink 1011 is for dissipating heat to the outside via the stacked substrate 102 and the base plate 103, the heat generated by the power semiconductor chip 101. Compared to IGBT power semiconductor modules for general industrial use, high reliability is demanded of an IGBT power semiconductor module used for electric trains. Reliability evaluation against temperature variation addresses one such demand. For reliability evaluation, for example, a ΔTc power cycle is used. A ΔTc power cycle is a test in which a cycle is recursively performed and includes, as one cycle, supplying energy until a case temperature (Tc) reaches an arbitrary temperature, stopping the supply of energy at the time point when the case temperature has reached the arbitrary temperature, and standing by until the case temperature returns to the state before the supply of energy.

Therefore, in an IGBT power semiconductor module for general industrial use, while low-cost, highly conductive copper (Cu) and copper alloys are used in the base plate 103, in an IGBT power semiconductor module for electric trains and for which high reliability is demanded, a composite material in which silicon carbide is contained in aluminum or in an aluminum alloy, such as AlSiC, is used in the base plate 103. Hereinafter, the base plate 103 in which AlSiC is used will be indicated as an AlSiC base plate.

AlSiC has a lower thermal expansion coefficient than copper and therefore, is good in terms of deformation with respect to temperature variation. Due to process constraints, as depicted in FIG. 11, an uppermost surface of the AlSiC base plate is covered by a soft aluminum (Al) metal layer 1010 of about 200 μm. As for the heat sink 1011, as depicted in FIG. 11, surface roughness based unevenness 109 is present. Since the surface of the heat sink 1011 is subject to a hardening process, for example, the heat sink 1011 may be formed using Al and in such a case, is not easily deformed by a pressing force of the base plate 103. However, the AlSiC base plate has a soft Al metal layer 1010. Therefore, in a power semiconductor module using the AlSiC base plate, when the heat sink 1011 is mounted, as depicted in FIG. 12, the soft Al metal layer 1010 is deformed by a pressing force of the base plate 103, whereby gaps due to the unevenness 109 may be filled. As a result, adhesiveness of the heat sink 1011 and the power semiconductor module improves.

Further, refer to Japanese Laid-Open Patent Publication No. 2003-86745 describing a known technique. According to the known technique, in a power semiconductor module, a metal foil is inserted in a gap between a heat sink and a radiating plate in which warp is generated by screwing fastening screws, and the gap is filled with high heat conductive grease, thereby arranging the metal foil in a flow path of the heat generated by a Si (silicon) chip, whereby thermal resistance between the heat sink and the radiating plate is reduced.

SUMMARY OF THE INVENTION

According to an embodiment of the present invention, a semiconductor device includes a base plate to which a stacked substrate is bonded, a semiconductor chip being mounted on the stacked substrate; and a heat sink mounted to the base plate, via a thermal paste and a metal ring.

In the embodiment, a center hole of the metal ring is provided to face the semiconductor chip, via the base plate, and the thermal paste fills the center hole.

In the embodiment, the metal ring is formed using a material having a same hardness as a hardness of the heat sink, or a material having a lower hardness than the hardness of the heat sink.

In the embodiment, the metal ring is formed using copper or aluminum, or an alloy that contains the copper or the aluminum, or that contains both the copper and the aluminum.

In the embodiment, the base plate is constituted by a composite material in which magnesium or a magnesium alloy contains silicon carbide.

In the embodiment, the base plate has an uninterrupted protrusion (ring-shaped protrusion portion) that is provided at a part of the base plate in contact with the metal ring so as to surround an opening of the metal ring.

In the embodiment, the base plate has an uninterrupted groove (ring-shaped groove portion) that is provided at a part of the base plate in contact with the metal ring.

In the embodiment, the metal ring has a first part (first side) in contact with the base plate and a second part (second side) in contact with the heat sink, an uninterrupted protrusion (ring-shaped protrusion portion) being provided at the first part and/or the second part.

In the embodiment, a cross-section of the metal ring has an oval shape.

According to another embodiment of the present invention, a method of manufacturing a semiconductor device, includes bonding to a base plate, a stacked substrate on which a semiconductor chip is mounted; applying thermal paste to the base plate or to a heat sink; mounting a metal ring to the base plate or the heat sink, a thickness of the metal ring being at most a thickness of the thermal paste; and mounting the heat sink so that the thermal paste and the metal ring are between the base plate and the heat sink.

In the embodiment, the metal ring has a protrusion. A height of the protrusion is at most half of a thickness of a part of the metal ring without the protrusion. A thickness of the metal ring including the protrusion is at most 1.5 times a thickness of the thermal paste.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is a perspective view of a base plate and a metal ring of the power semiconductor module according to the embodiment;

FIG. 3 is a cross-sectional view of an A-A' part of the metal ring of the power semiconductor module according to the embodiment depicted in FIG. 2;

DETAILED DESCRIPTION OF THE INVENTION

First problems related to the techniques above will be discussed. As described above, the AlSiC base plate is good with respect to deformation due to temperature variation. However, the AlSiC base plate has a disadvantage in that heat transfer is greatly reduced compared to copper. Recently, a composite material in which magnesium or a magnesium alloy contains silicon carbide, such as MgSiC, has been proposed as an improved material to address this disadvantage. Hereinafter, the base plate 103 using MgSiC will be indicated as an MgSiC base plate. The MgSiC base plate has mechanical characteristics, such as a thermal expansion coefficient, that are about the same as those of the AlSiC base plate, and the MgSiC base plate uses a material that improves heat transfer by about 20% as compared to the AlSiC base plate.

Figure 13:
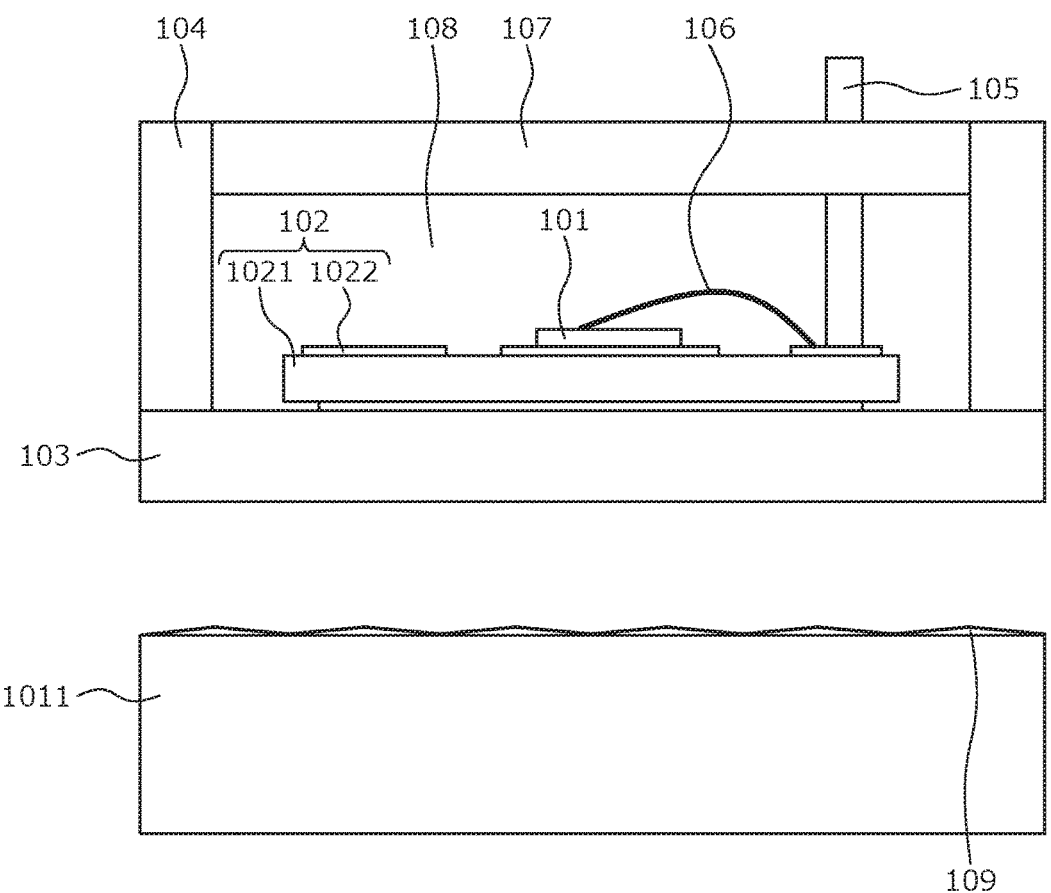
FIG. 13 is a cross-sectional view of a configuration before a heat sink is mounted in a power semiconductor module of a related art, using an MgSiC base plate.
Figure 14:
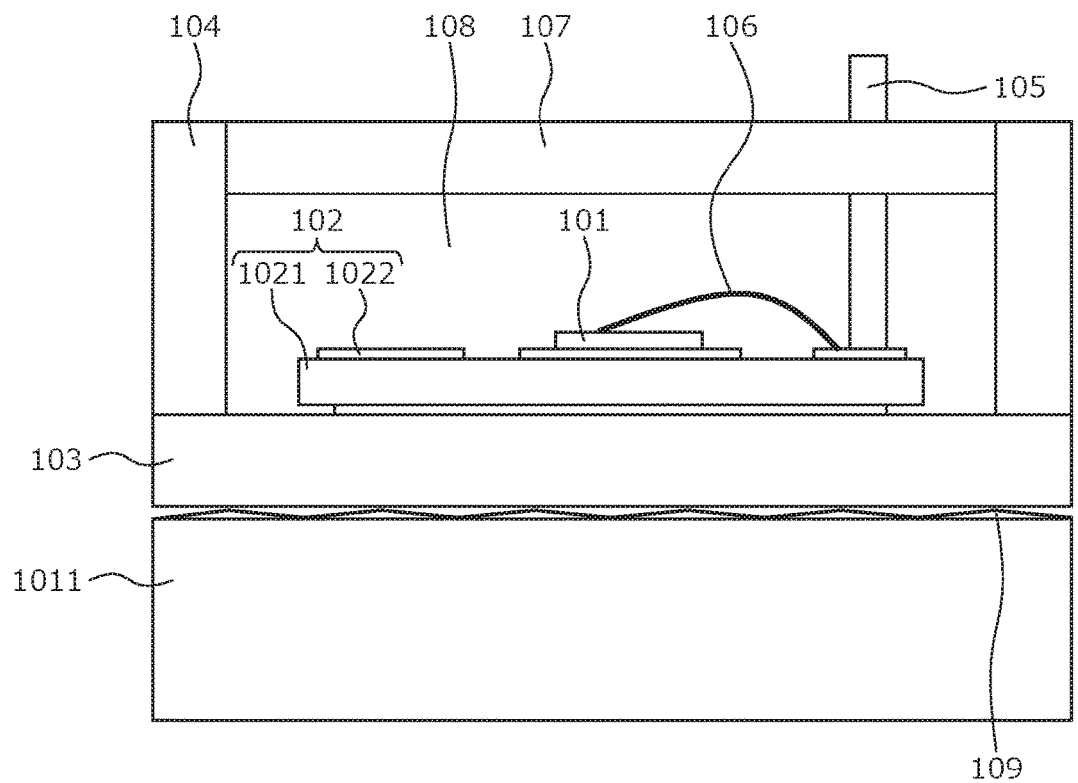
FIG. 14 is a cross-sectional view of the configuration after the heat sink is mounted in the power semiconductor module of a related art, using the MgSiC base plate.

FIG. 13 is a cross-sectional view of a configuration before a heat sink is mounted in a power semiconductor module of a related art, using the MgSiC base plate. FIG. 14 is a cross-sectional view of the configuration after the heat sink is mounted in the power semiconductor module of a related art, using the MgSiC base plate. As depicted in FIG. 13, the MgSiC base plate is structured by only an MgSiC member, and no soft metal layer is present on the surface. Furthermore, for the MgSiC base plate, since SiC powder is exposed on the surface, an uppermost surface has a hard quality and as depicted in FIG. 14, the MgSiC base plate is not deformed.

Therefore, the gaps due to the unevenness 109 of the heat sink 1011 cannot be filled and when an MgSiC base is used, more gaps may be formed between the base plate 103 and the heat sink 1011 as compared to an AlSiC base. When many gaps are formed, thermal paste, which is not depicted, expands due to heat generated by the power semiconductor chip 101 and is pushed out (pumped out) from the gaps. Therefore, the thermal paste may become depleted with repeated heat generation by the power semiconductor chip 101. Thermal paste is a thermal grease in which particles of high thermal conductivity are mixed in a highly viscous liquid like grease. Thermal paste is for improving heat transfer by filling fine gaps between a heat generating element (e.g., the base plate 103) and a heat sink (e.g., the heat sink 1011). Therefore, if the thermal paste is depleted, thermal conduction from the base plate 103 to the heat sink 1011 may become insufficient, and the power semiconductor chip 101 may breakdown due to the heat.

Figure 1:
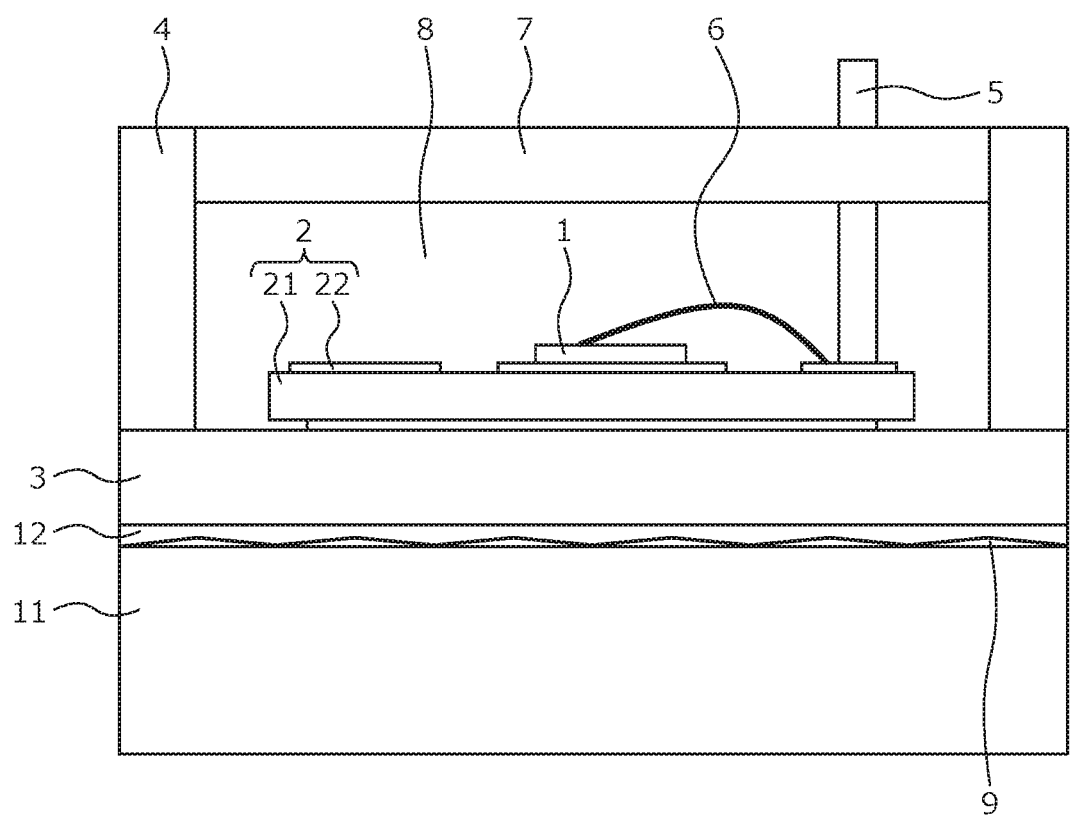
FIG. 1 is a cross-sectional view of a configuration of a power semiconductor module according to an embodiment.

Embodiments of a semiconductor device and a method of manufacturing a semiconductor device according to the present invention will be described in detail with reference to the accompanying drawings. FIG. 1 is a cross-sectional view of a configuration of the power semiconductor module according to an embodiment.

As depicted in FIG. 1, the power semiconductor module includes a power semiconductor chip 1, a stacked substrate 2, a base plate 3, a case 4, a metal terminal 5, a metal wire 6, a cover 7, a sealant 8, a heat sink 11, and a metal ring 12.

The power semiconductor chip 1 is an IGBT, a MOS-FET, or a diode, etc. The stacked substrate 2 is constituted by an insulated substrate 21 such as a ceramic substrate that ensures insulation, and a conductive plate 22 constituted by, for example, a copper (Cu) plate formed on a front surface (side facing the power semiconductor chip 1) and/or a rear surface (side facing the base plate 3) of the insulated substrate 21. The stacked substrate 2 is a substrate on which the conductive plate 22 is provided on at least one side of the insulated substrate 21. The power semiconductor chip 1 is bonded on the conductive plate 22 by a bonding material, which is not depicted, such as solder. The base plate 3 is bonded on the conductive plate 22 of the rear surface by a bonding material, which is not depicted, such as solder. The base plate 3 is a cooling body for dissipating heat and is constituted by an MgSiC base.

Further, a first end of the metal wire 6 is bonded, as an electrical connection wire, to an upper surface (surface on a first side opposite a second side having a surface in contact with the conductive plate 22) of the power semiconductor chip 1. A second end of the metal wire 6 is bonded to the conductive plate 22 to which the metal terminal 5 is fixed. In FIG. 1, while the power semiconductor chip 1 and the conductive plate 22 are connected using the metal wire 6, the power semiconductor chip 1 and the conductive plate 22 may be connected using a lead frame.

The case 4 is adhered to the base plate 3 by an adhesive. The case 4 is a resin case molded using a thermoplastic resin such as PPS. For the adhesive, an epoxy resin, a silicone resin, etc. is used. Further, the sealant 8 is constituted by an epoxy resin, a silicone resin, etc. and fills the case 4; and the cover 7 is disposed protecting the sealant 8.

The heat sink 11 is for dissipating to the outside, heat generated by the power semiconductor chip 1. The heat sink 11 may be configured to have a shape that increases surface area such as a bellow shape or a shape having fins or rods protruding so as to enable more heat to be dissipated. The heat sink 11 is formed using, for example, stainless steel (Steel Use Stainless (SUS)), aluminum (Al), an Al alloy, copper, or a Cu alloy. On the heat sink 11, surface roughness based unevenness 9 is present.

In the embodiment, the heat sink 11 is mounted to the base plate 3, via thermal paste, which is not depicted, and the metal ring 12. The thermal paste is provided to improve heat transfer by being applied and spread between the base plate 3 and the heat sink 11 to fill fine gaps. The thermal paste is a grease in which particles of high thermal conductivity such as silver (Ag), copper (Cu), or aluminum oxide, etc. are mixed in a highly viscous liquid such as silicone oil, etc. The metal ring 12 is provided to improve adhesiveness by being deformed along the unevenness 9 of the surface of the heat sink 11 by a pressing force of the base plate 3 and the heat sink 11 to thereby fill gaps formed by the unevenness 9. In this manner, the gaps that are formed by the surface roughness based unevenness 9 of the heat sink 11 and that cannot be filled by the base plate 3 constituted by the MgSiC base having a high degree of hardness and low deformation, may be filled by the metal ring 12. The filling of the gaps seals the thermal paste between the base plate 3 and the heat sink 11, enabling depletion of the thermal paste due to pump out to be prevented.

To structure the metal ring 12 to be deformed by the surface roughness based unevenness 9 of the heat sink 11, the metal ring 12 is formed using a material having about the same degree of hardness as that of the heat sink 11, or a material having a lower degree of hardness. Here, about the same degree of hardness is a hardness that is 1.0 to 1.5 times a Vickers hardness of the heat sink 11. When harder than this, the metal ring 12 cannot be deformed along the surface roughness based unevenness 9 of the heat sink 11, and pump out of the thermal paste occurs. Further, the metal ring 12 may be a metal having good heat transfer in order to conduct heat. For example, when the heat sink 11 is formed using SUS having a Vickers hardness of about 150 Hv, the metal ring 12 may be formed using Al or an Al alloy having a Vickers hardness of about 25 Hv, Cu or a Cu alloy having a Vickers hardness of about 46 Hv, each being softer than the SUS and having good heat transfer. When the heat sink 11 is formed using Cu or a Cu alloy, the metal ring 12 may be formed using Cu, a Cu alloy, Al, or an Al alloy that is about a same hardness or softer than Cu or the Cu alloy and that has good heat transfer. Further, when the heat sink 11 is formed using Al or an Al alloy, the metal ring 12 may be formed using Al or an Al alloy that is about a same hardness or softer than Al or the Al alloy and that has good heat transfer. The metal ring 12 may be another metal provided the hardness is lower than that of the heat sink 11 and the heat transfer is good, and may be, for example, silver (Ag) or gold (Au), or an alloy containing at least silver (Ag) or gold (Au).

FIG. 2 is a perspective view of the base plate and the metal ring of the power semiconductor module according to the embodiment. As depicted in FIG. 2, the metal ring 12 has an outer perimeter that is about a same as that of the base plate 3. Since the outer perimeter is about the same as that of the base plate 3, outside the metal ring 12, depletion of the thermal paste occurs due to pumping out, and at this part, degradation of the heat dissipation may be prevented. Further, the outer perimeter of the metal ring 12 is made large, enabling a thermal paste application area (opening) 13 described hereinafter to be made large.

Further, a center hole of the metal ring 12 is provided directly below the power semiconductor chip 1 (immediate lower side of the power semiconductor chip 1, i.e., the side thereof facing toward the heat sink 11) and the center hole constitutes the thermal paste application area 13 where the thermal paste is applied, i.e., a part facing the power semiconductor chip 1 constitutes the thermal paste application area 13. Therefore, heat from the power semiconductor chip 1 may pass through the thermal paste and efficiently escape to the heat sink 11. In FIG. 2, while the center hole of the metal ring 12 is depicted to be one, the center hole may be provided in plural. Further, in FIG. 2, while the center hole of the metal ring 12 has a rectangular shape, the center hole may have a circular or oval shape. In any case, the center hole of the metal ring 12 suffices to be provided at least directly below the power semiconductor chip 1.

FIG. 3 is a cross-sectional view of an A-A' part of the metal ring of the power semiconductor module according to the embodiment depicted in FIG. 2. The cross-section of the metal ring is not limited to a rectangular shape or a circular shape and may be any among various shapes. As depicted in FIG. 3, the cross-section of the metal ring 12 may have an oval shape, whereby the metal ring 12 deforms more easily, increasing a shielding property of the thermal paste.

Further, a thickness w of the metal ring 12 may be a same thickness as that of the applied thermal paste or thinner. For example, since the thickness of the thermal paste is 50 to 100 µm, the thickness w of the metal ring 12 is 50 to 100 µm because when the thickness w of the metal ring 12 is too thick, the amount of applied thermal paste increases, reducing the thermal conduction property. When the thickness w of the metal ring 12 is too thin, the unevenness 9 of the heat sink 11 may not be compensated, forming gaps with the heat sink 11 and therefore, the thickness w of the metal ring 12 may be greater than a height of the unevenness 9 of the heat sink 11.

Figure 4:
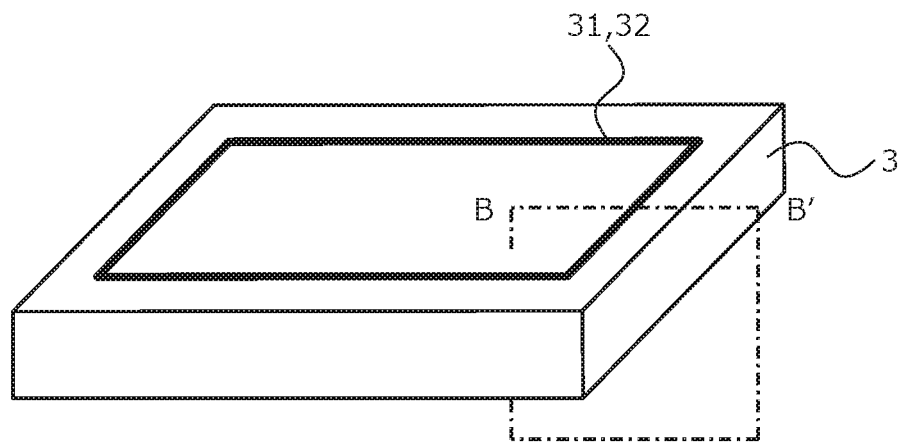
FIG. 4 is a perspective view of a rear surface of the base plate of the power semiconductor module according to the embodiment.

FIG. 4 is a perspective view of a rear surface of the base plate 3 of the power semiconductor module according to the embodiment. As depicted in FIG. 4, an uninterrupted protrusion (ring-shaped protrusion portion) 31 or groove (ring-shaped groove portion) 32 may be provided on the rear surface of the base plate 3. Here, the protrusion 31 that is uninterrupted is provided so as to have no gaps in the protrusion 31 and similarly for the groove 32 that is uninterrupted. The protrusion 31 or the groove 32 is provided where the metal ring 12 is provided. The protrusion 31 or the groove 32 meshes with the metal ring 12 to become embedded in the gaps between the metal ring 12 and the base plate 3 to further reduce the gaps, enabling the shielding property to be further improved. Since the protrusion 31 or the groove 32 is uninterrupted, push out of the thermal paste from the protrusion 31 or the groove 32 to the outside may be prevented. In FIG. 4, while the protrusion 31 or the groove 32 is depicted to be singular, the protrusion 31 or the groove 32 may be plural, or may be a combination where one is the protrusion 31 and another is the groove 32, etc.

Figure 5:
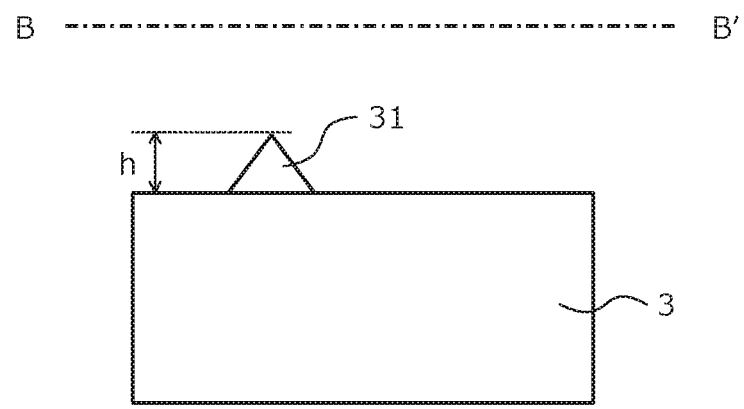
FIG. 5 is a cross-sectional view of a part B-B' of the power semiconductor module according to the embodiment depicted in FIG. 4.
Figure 6:
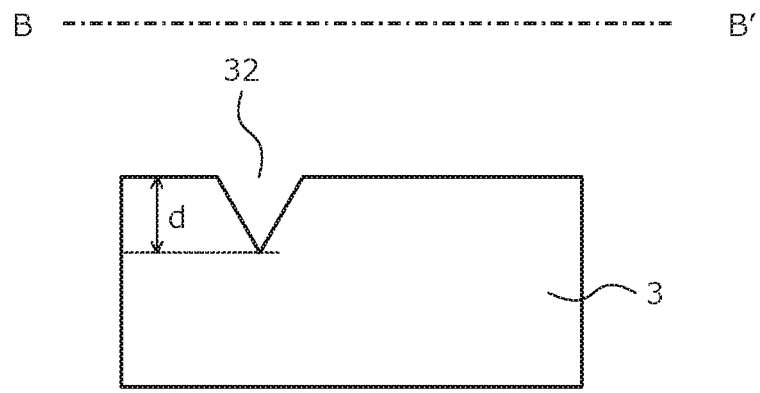
FIG. 6 is a cross-sectional view of the part B-B' of the power semiconductor module according to the embodiment depicted in FIG. 4.

FIGS. 5 and 6 are cross-sectional views of a part B-B' of the power semiconductor module according to the embodiment depicted in FIG. 4. FIG. 5 is a cross-sectional view in the case of the protrusion 31 and FIG. 6 is a cross-sectional view in the case of the groove 32. A height h of the protrusion 31 may be a height less than the thickness of the applied thermal paste and may be half the thickness of the metal ring 12 or less. Further, a depth d of the groove 32 may be half the thickness of the metal ring 12 to the thickness of the metal ring 12. Formation of the protrusion 31 or the groove 32 prevents damage such as tearing of the metal ring 12 and further improves the shielding property of the thermal paste.

Further, in FIG. 5, while the protrusion 31 has a triangular shape, the protrusion 31 suffices to have a shape that easily meshes with the metal ring 12 and may have another shape such as, for example, an inverted U-shape. Similarly, in FIG. 6, while the groove 32 has a V-shape, the groove 32 suffices to have a shape that easily meshes with the metal ring 12 and may have another shape such as, for example, a U-shape.

Figure 7:
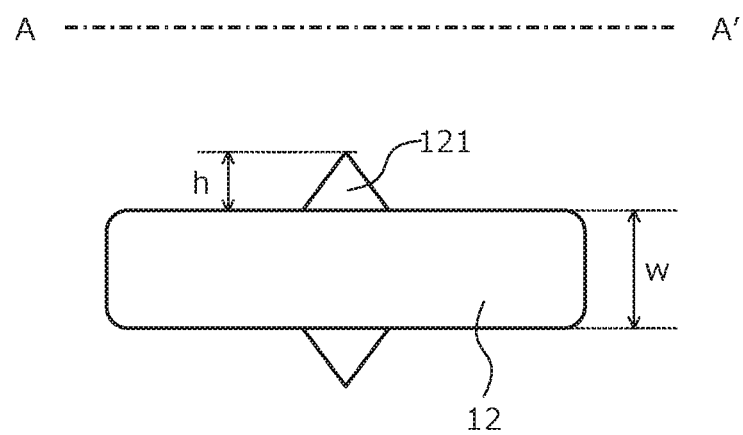
FIG. 7 is another cross-sectional view of the A-A' part of the metal ring of the power semiconductor module according to the embodiment depicted in FIG. 2.

FIG. 7 is another cross-sectional view of the A-A' part of the metal ring of the power semiconductor module according to the embodiment depicted in FIG. 2. As depicted in FIG. 7, on the metal ring 12 as well, a protrusion (ring-shaped protrusion portion) 121 that is uninterrupted may be provided as with the base plate 3. For example, as depicted in FIG. 7, the protrusion 121 that is uninterrupted may be provided in both a part (first side) in contact with the base plate 3 and a part (second side) in contact with the heat sink 11. Although not depicted, on the metal ring 12, at any one of the part in contact with the base plate 3 and the part in contact with the heat sink 11, the protrusion 121 that is uninterrupted may be provided. In FIG. 7, the protrusion 121 may be one per one contact surface or may be more than one per one contact surface. The protrusion 121 is embedded in the gaps between the metal ring 12 and the base plate 3, or the gaps between the metal ring 12 and the heat sink 11, enabling the gaps to be further reduced and the shielding property to be further improved. Similarly, the protrusion shape suffices to easily mesh with the base plate 3 or the heat sink 11 and, for example, may be a triangular shape or an inverted U-shape.

Further, the height h of the protrusion 121 of the metal ring 12 may be half of the thickness w of the part of the metal ring 12 without the protrusion 121, or less. The thickness w may correspond to a first thickness at an area adjacent to the protrusion 121. A thickness (w+h) of the metal ring 12 including the protrusion 121 may be 1.5 times the thickness of the thermal paste or less. The thickness (w+h) may correspond to a second thickness at an area at the protrusion 121. Formation of the protrusion 121 in this manner prevents damage such as tearing of the metal ring 12 and further improves the shielding property of the thermal paste.

Figure 8:
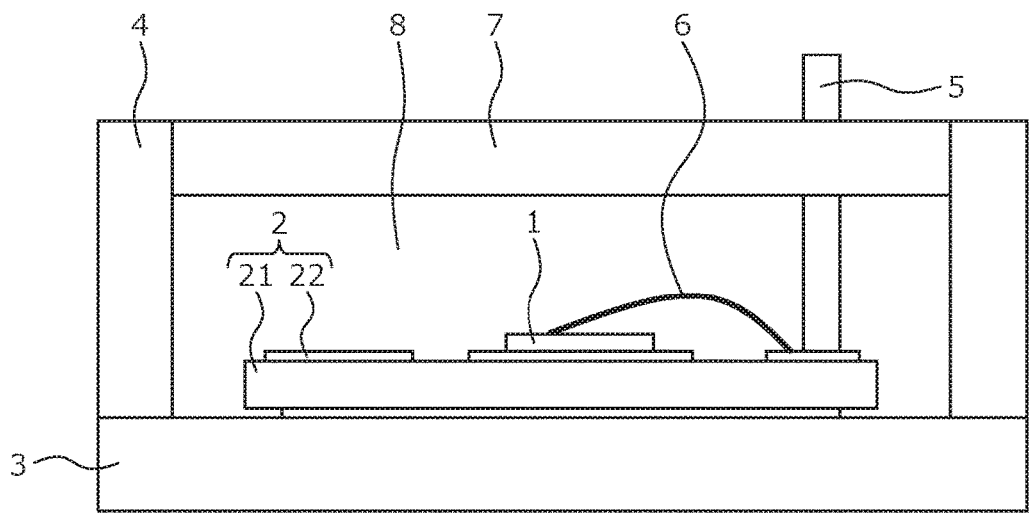
FIG. 8 is a cross-sectional view of the power semiconductor module according to the embodiment during manufacture.
Figure 9:
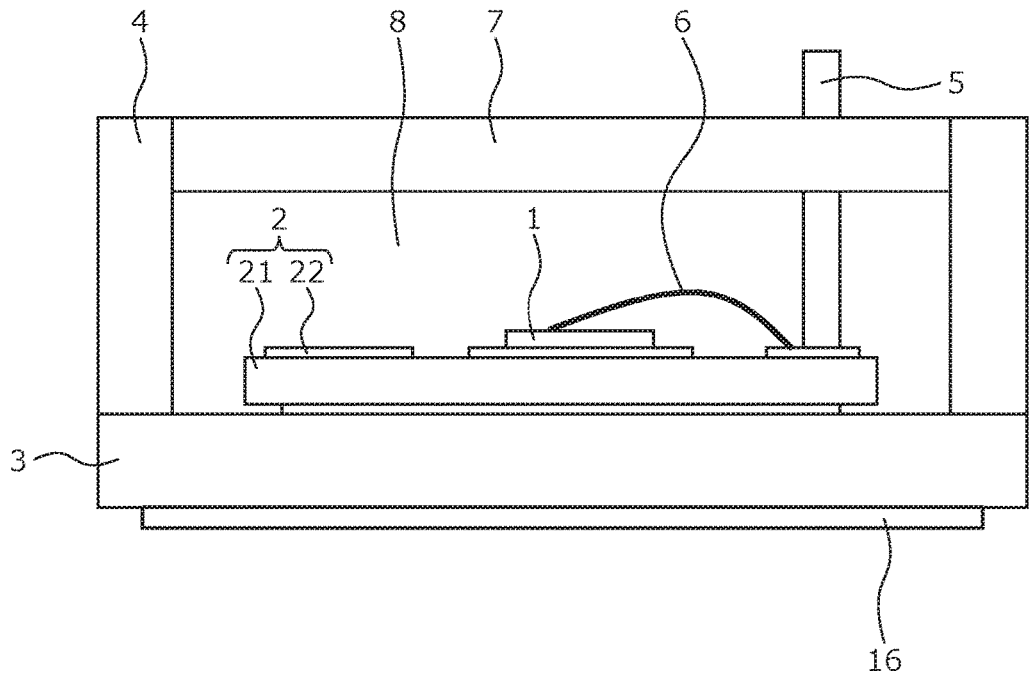
FIG. 9 is a cross-sectional view of the power semiconductor module according to the embodiment during manufacture.
Figure 10:
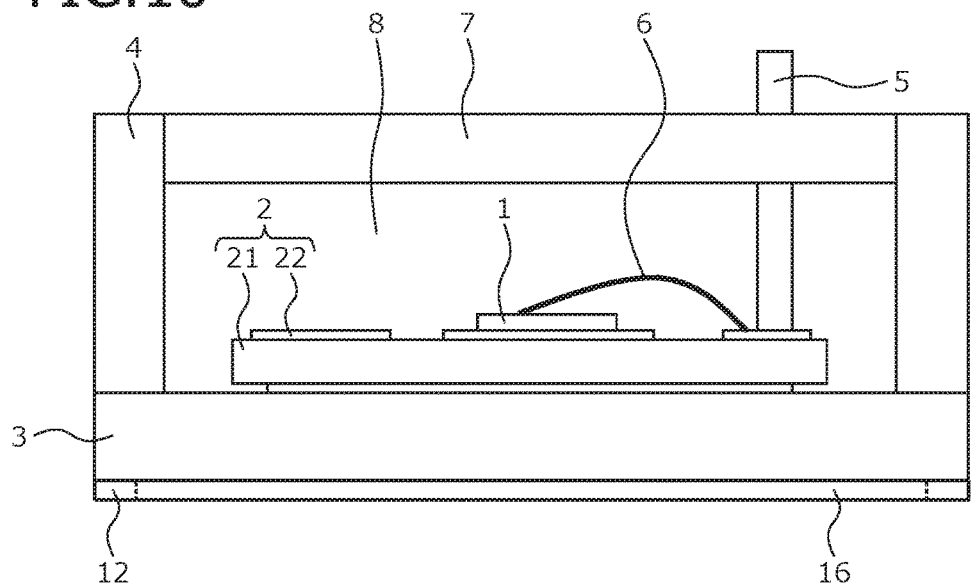
FIG. 10 is a cross-sectional view of the power semiconductor module according to the embodiment during manufacture.
Figure 11:
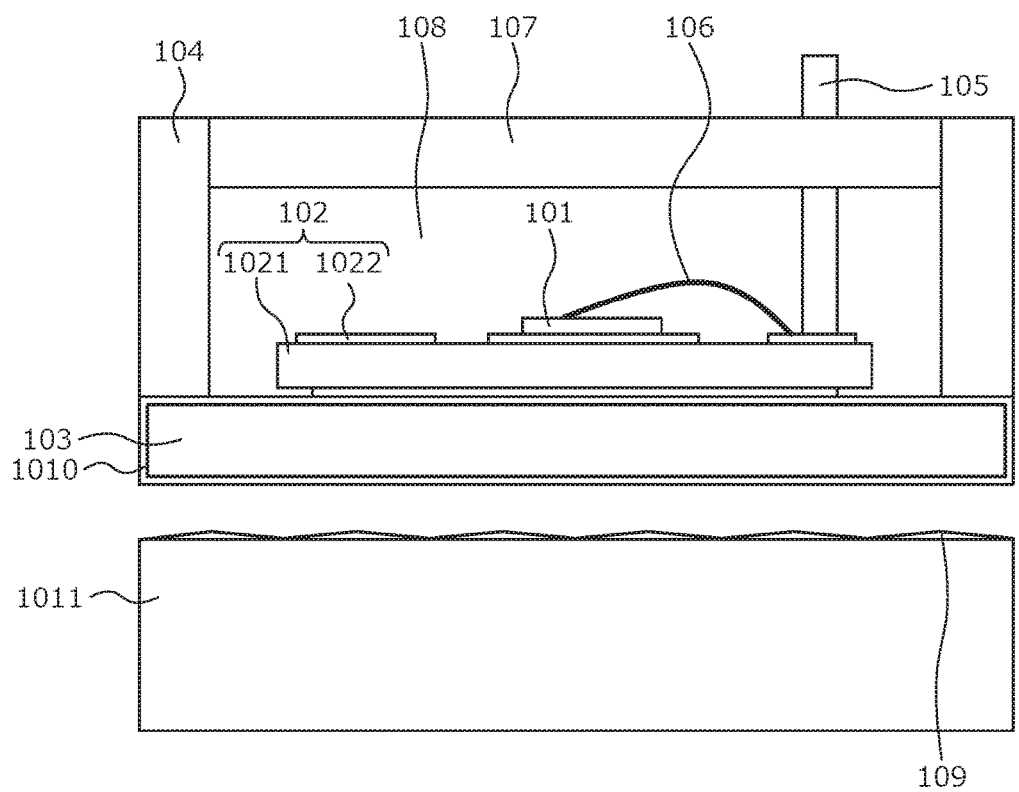
FIG. 11 is a cross-sectional view of a configuration before a heat sink is mounted in a power semiconductor module of a related art.
Figure 12:
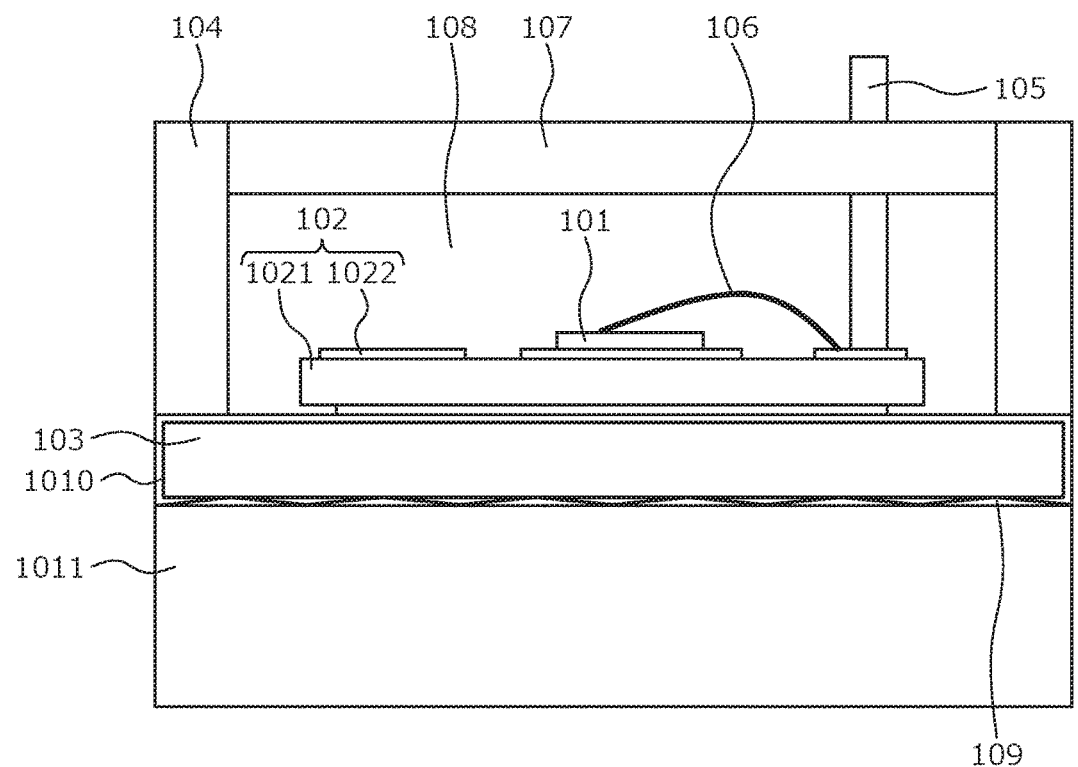
FIG. 12 is a cross-sectional view of the configuration after the heat sink is mounted in the power semiconductor module of a related art.

A method of manufacturing the power semiconductor module according to the embodiment will be described. FIGS. 8, 9, and 10 are cross-sectional views of the power semiconductor module according to the embodiment during manufacture. First, the power semiconductor chip 1 is bonded to the conductive plate 22 of the stacked substrate 2 using a bonding material such as solder, whereby the power semiconductor chip 1 is mounted on the stacked substrate 2. Next, the power semiconductor chip 1 and the conductive plate 22 of the stacked substrate 2 are electrically connected by the metal wire 6. The metal terminal 5 is mounted to the conductive plate 22 that is connected to the metal wire 6. Next, the stacked substrate 2 on which these components are mounted is bonded to the base plate 3 using a bonding material such as solder; and the power semiconductor chip 1, and a stacked assembly constituted by the stacked substrate 2 and the base plate 3 is assembled. Further, in place of the metal wire 6, a lead frame may be bonded.

Next, the case 4 is adhered to this stacked assembly by an adhesive such as a silicone adhesive. Next, the case 4 is filled with the sealant 8 such as a hard resin, e.g., an epoxy, which is hardened by performing heat treatment under predetermined conditions. Next, the cover 7 is mounted so that the sealant 8 does not leak outside. The state up to here is depicted in FIG. 8.

Next, a thermal paste 16 is applied in the thermal paste application area 13 of the rear surface of the base plate 3 and has a predetermined thickness. The state up to here is depicted in FIG. 9. Next, the metal ring 12 of the rear surface of the base plate 3 is mounted. The state up to here is depicted in FIG. 10. The thermal paste 16 may be applied after the metal ring 12 is mounted.

Next, the heat sink 11 is mounted to the base plate 3, whereby the thermal paste 16 and the metal ring 12 are between the heat sink 11 and the base plate 3. The heat sink 11, for example, may be fixed to the base plate 3 by screws. As described, the power semiconductor module according to the embodiment of the present invention may be manufactured.

In the method above, although the thermal paste 16 is applied to the thermal paste application area 13 of the rear surface of the base plate 3, the thermal paste 16 may be applied to the heat sink 11. In this case, the thermal paste 16 is applied to a region facing the thermal paste application area 13 of the heat sink 11 and the thermal paste 16 has the predetermined thickness. Next, the metal ring 12 is mounted to the rear surface of the base plate 3. In this case as well, the thermal paste 16 may be applied after the metal ring 12 is mounted. Next, the heat sink 11 is mounted to the base plate 3, whereby the thermal paste 16 and the metal ring 12 are between the heat sink 11 and the base plate 3.

As described, according to the power semiconductor module of the embodiment, the heat sink is mounted to the base plate, via the thermal paste and the metal ring. The metal ring is deformed by the unevenness of the surface of the heat sink and is thereby embedded in gaps caused by the unevenness, whereby the adhesiveness between the heat sink and the base plate improves. Therefore, depletion of the thermal paste due to pump out is suppressed, enabling power semiconductor chip failure caused by heat to be suppressed.

Further, the outer perimeter of the metal ring is about a same as the base plate. As a result, outside the metal ring, depletion of the thermal paste due to pump out occurs, and degradation of the heat dissipation may be prevented at this part. Further, directly below the power semiconductor chip is the region where the thermal paste is applied. Therefore, heat from the power semiconductor chip passes through the thermal paste and may efficiently escape to the heat sink.

Further, on the rear surface of the metal ring, the uninterrupted protrusion or groove may be provided. The protrusion or groove meshes with the metal ring to become embedded in the gaps between the metal ring and the base plate to further reduce the gaps, enabling the shielding property to be improved.

According to the embodiments described, the heat sink is mounted to the base plate, via the thermal paste and the metal ring. The metal ring is deformed by the unevenness of the surface of the heat sink and thereby fills gaps caused by the unevenness, whereby the adhesiveness between the heat sink and the base plate improves. Therefore, depletion of the thermal paste due to pump out is suppressed, enabling power semiconductor chip failure caused by heat to be suppressed.

The semiconductor device and the method of manufacturing a semiconductor device according to the embodiments achieve an effect in that the depletion of the thermal paste due to pump out is suppressed, enabling power semiconductor chip failure caused by heat to be suppressed.

As described, the semiconductor device and the method of manufacturing a semiconductor device according to the embodiments are useful for power semiconductor devices used in power converting equipment such as inverters, in power supply devices such as in various industrial machines, in igniters for automobiles, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
    a stacked substrate having opposing first and second sides;
    a semiconductor chip mounted on the first side of the stacked substrate;
    a base plate having opposing first and second sides and being mounted on the second side of the stacked substrate;
    a metal ring having a through opening, and having opposing first and second sides, the first side of the metal ring being mounted on the second side of the base plate; and
    a heat sink mounted to the second side of the base plate, via a thermal paste, with the metal ring therebetween.

2. The semiconductor device according to claim 1, wherein
    the metal ring has the through opening provided at a position corresponding to an area in which the semiconductor chip is disposed in the plan view, and
    the thermal paste is disposed between the heat sink and the base plate at at least an area corresponding to the through opening of the metal ring.

3. The semiconductor device according to claim 1, wherein the metal ring is comprised of a material having a hardness equal to or lower than a hardness of a material of the heat sink.

4. The semiconductor device according to claim 1, wherein the metal ring is comprised of a material containing one of copper, aluminum, and an alloy containing at least one of copper and aluminum.

5. The semiconductor device according to claim 1, wherein the base plate is comprised of a material containing silicon carbide and at least one of magnesium and a magnesium alloy.

6. The semiconductor device according to claim 1, wherein
    the metal ring has the through opening, and
    the base plate has a ring-shaped protrusion portion that is in contact with the metal ring so as to surround the through opening.

7. The semiconductor device according to claim 1, wherein
    the metal ring has the through opening, and
    the base plate has a ring-shaped groove portion that is in contact with the metal ring so as to surround the through opening.

8. The semiconductor device according to claim 1, wherein the metal ring has the through opening, and
    at least one of the first and second sides of the metal ring has an ring-shaped protrusion portion surrounding the through opening.

9. The semiconductor device according to claim 1, wherein a cross section of the metal ring has an oval shape.

10. A method of manufacturing a semiconductor device, comprising:
    providing a semiconductor chip, a stacked substrate having opposing first and second sides, a base plate having opposing first and second sides, a heat sink and a metal ring having a through opening;
    mounting the semiconductor chip to the first side of the stacked substrate, and mounting the stacked substrate to the first side of the base plate;
    applying a thermal paste to one of the heat sink and the second side of the base plate;
    mounting the heat sink to the second side of the base plate using the thermal paste, with the metal ring therebetween, the thermal paste being disposed within an area inside of the through opening of the metal ring, a thickness of the metal ring being at most a thickness of the thermal paste.

11. The method according to claim 10, wherein
    the metal ring has a ring-shaped protrusion portion, having a first thickness at an area adjacent to the protrusion portion and a second thickness at an area at the protrusion portion,
    a height of the protrusion is at most 0.5 times of the first thickness of the metal ring, and
    the second thickness of the metal ring is at most 1.5 times a thickness of the thermal paste.

* * * * *